United States Patent
Lee et al.

(10) Patent No.: US 10,326,023 B2
(45) Date of Patent: Jun. 18, 2019

(54) SEMICONDUCTOR DEVICE INCLUDING FIN STRUCTURE WITH TWO CHANNEL LAYERS AND MANUFACTURING METHOD THEREOF

(71) Applicant: TAIWAN SEMICONDUCTOR MANUFACTURING CO., LTD., Hsinchu (TW)

(72) Inventors: Tung Ying Lee, Hsinchu (TW); Chien-Chang Su, Kaohsiung (TW); Wang-Chun Huang, Hsinchu (TW); Yasutoshi Okuno, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/972,961

(22) Filed: May 7, 2018

(65) Prior Publication Data
US 2018/0254347 A1    Sep. 6, 2018

Related U.S. Application Data

(62) Division of application No. 15/439,035, filed on Feb. 22, 2017, now Pat. No. 9,966,469, which is a division
(Continued)

(51) Int. Cl.
*H01L 29/165* (2006.01)
*H01L 21/306* (2006.01)
(Continued)

(52) U.S. Cl.
CPC ...... *H01L 29/7851* (2013.01); *H01L 21/0217* (2013.01); *H01L 21/02532* (2013.01);
(Continued)

(58) Field of Classification Search
CPC ............ H01L 29/785; H01L 29/66795; H01L 29/847; H01L 21/337; H01L 27/0207
(Continued)

(56) References Cited

U.S. PATENT DOCUMENTS 7,323,373 B2   1/2008 Mathew et al.
7,396,775 B2   7/2008 Lee
(Continued)

FOREIGN PATENT DOCUMENTS

KR   10-2014-0122096 A   10/2014

OTHER PUBLICATIONS

Non-Final Office Action issued in related U.S. Appl. No. 14/604,537, dated Jun. 2, 2016.
(Continued)

*Primary Examiner* — Thinh T Nguyen
(74) *Attorney, Agent, or Firm* — McDermott Will & Emery LLP (57) ABSTRACT

A method for manufacturing a semiconductor device includes forming a fin structure having a top face and a first side face and a second side face opposite to the first side face, forming a lower cover layer over the first and second side faces, forming an upper cover layer over the first and second side faces, the upper cover layer being spaced apart from the lower cover layer so that exposed regions of the first and second side faces are formed between the lower cover layer and the upper cover layer, and forming first and second semiconductor layers over the exposed regions of the first and second side faces, respectively.

20 Claims, 11 Drawing Sheets

Related U.S. Application Data of application No. 14/604,537, filed on Jan. 23, 2015, now Pat. No. 9,601,626.

(51) Int. Cl.
| | | |
|---|---|---|
| *H01L 29/78* | (2006.01) | |
| *H01L 29/10* | (2006.01) | |
| *H01L 29/66* | (2006.01) | |
| *H01L 21/02* | (2006.01) | |
| *H01L 21/8234* | (2006.01) | |
| *H01L 21/8238* | (2006.01) | |
| *H01L 27/088* | (2006.01) | |
| *H01L 27/092* | (2006.01) | |
| *H01L 29/06* | (2006.01) | |
| *H01L 27/146* | (2006.01) | |
| *H01L 29/267* | (2006.01) | |

(52) U.S. Cl.
CPC .......... *H01L 21/30625* (2013.01); *H01L 21/823412* (2013.01); *H01L 21/823431* (2013.01); *H01L 21/823481* (2013.01); *H01L 21/823807* (2013.01); *H01L 21/823821* (2013.01); *H01L 21/823878* (2013.01); *H01L 27/0886* (2013.01); *H01L 27/0924* (2013.01); *H01L 29/0649* (2013.01); *H01L 29/1054* (2013.01); *H01L 29/165* (2013.01); *H01L 29/66795* (2013.01); *H01L 29/785* (2013.01); *H01L 21/0262* (2013.01); *H01L 27/1461* (2013.01); *H01L 29/267* (2013.01); *H01L 29/6681* (2013.01)

(58) Field of Classification Search
USPC ......... 257/401, 346, 349, E21.431; 438/254, 438/284.478
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,466,511 B2 | 6/2013 | Oh et al. |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 9,082,853 B2 | 7/2015 | Cheng et al. |
| 9,123,771 B2 | 9/2015 | Shen et al. |
| 9,252,243 B2 | 2/2016 | He et al. |
| 2005/0124101 A1 | 6/2005 | Beintner |
| 2005/0145932 A1* | 7/2005 | Park et al. .......... H01L 29/7851 257/328 |
| 2005/0145941 A1 | 7/2005 | Bedell et al. |
| 2007/0262353 A1 | 11/2007 | Nishiyama et al. |
| 2010/0044784 A1 | 2/2010 | Oh et al. |
| 2010/0311215 A1* | 12/2010 | Orlowski et al. ... H01L 29/7854 438/164 |
| 2011/0049613 A1 | 3/2011 | Yeh et al. |
| 2011/0117732 A1 | 5/2011 | Bauer et al. |
| 2013/0285153 A1 | 10/2013 | Lee et al. |
| 2014/0117462 A1* | 5/2014 | Cheng et al. ..... H01L 29/66803 257/410 |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2014/0299934 A1 | 10/2014 | Kim et al. |
| 2015/0228762 A1* | 8/2015 | He et al. ............... H01L 29/785 257/410 |
| 2016/0013185 A1 | 1/2016 | Greene et al. |
| 2016/0056045 A1 | 2/2016 | Huang et al. |

OTHER PUBLICATIONS

J. Bauer, et al., "Nanostructured silicon for Ge nanoheteroepitaxy", Microelectronic Engineering 97 (2012), pp. 169-172.

Notice of Allowance issued in related U.S. Appl. No. 14/604,537, dated Nov. 7, 2016.

Taiwanese Office Action issued in corresponding Taiwanese Patent Application No. 10-2015-0150020, dated Sep. 29, 2016, with English Translation.

Notice of Allowance issued in related parent U.S. Appl. No. 15/439,035, dated Jan. 9, 2018.

\* cited by examiner

SEMICONDUCTOR DEVICE INCLUDING FIN STRUCTURE WITH TWO CHANNEL LAYERS AND MANUFACTURING METHOD THEREOF

CROSS-CITATION TO RELATED APPLICATIONS

This application is a Divisional Application of U.S. Ser. No. 15/439,035 filed on Feb. 22, 2017, which is a Divisional Application of U.S. Ser. No. 14/604,537 filed on Jan. 23, 2015, now U.S. Pat. No. 9,601,626, issued on Mar. 21, 2017, the subject matter of which are incorporated by reference in their entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In addition, strained materials in source/drain (S/D) portions of the Fin FET utilizing selectively grown silicon germanium (SiGe) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel.

However, there are challenges to implementation of such features and processes in complementary metal-oxide-semiconductor (CMOS) fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
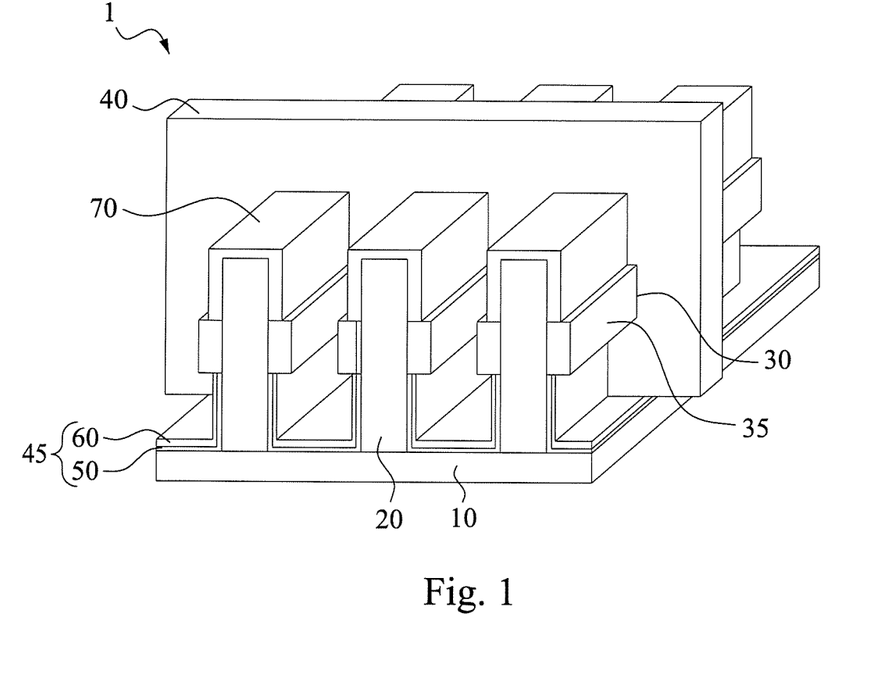
FIG. 1 is an exemplary perspective view of a semiconductor FET device having a fin structure (Fin FET) according to one embodiment of the present disclosure.
Figure 2:
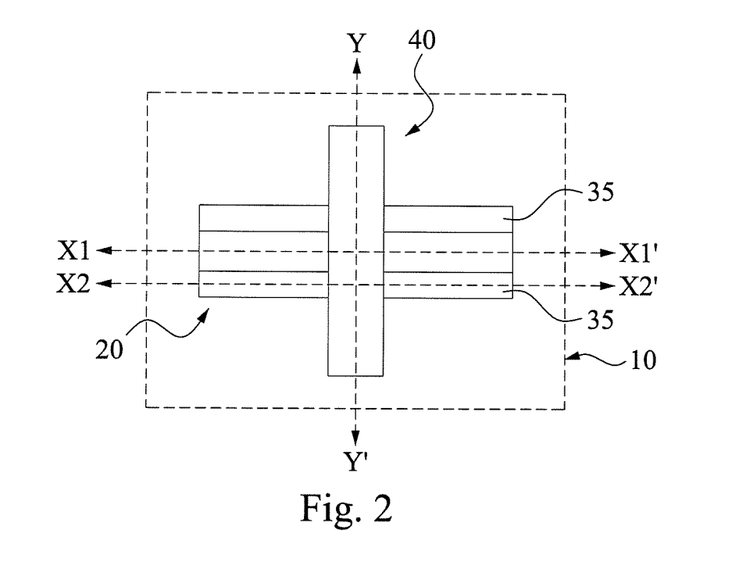
FIG. 2 is an exemplary plan view of the semiconductor device having a fin structure.
Figure 3:
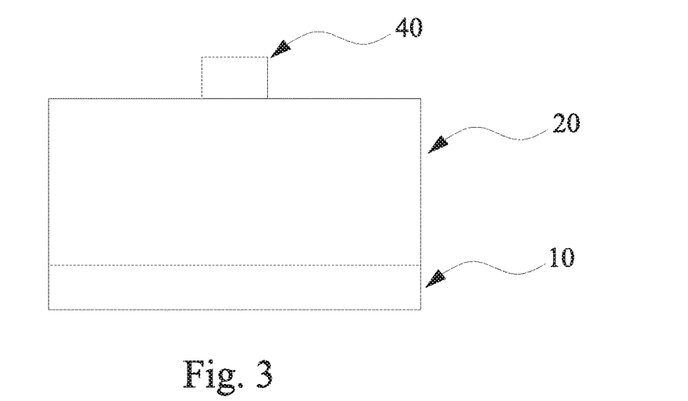
FIG. 3 is an exemplary cross sectional view along the line X1-X1' of FIG. 2.
Figure 4:
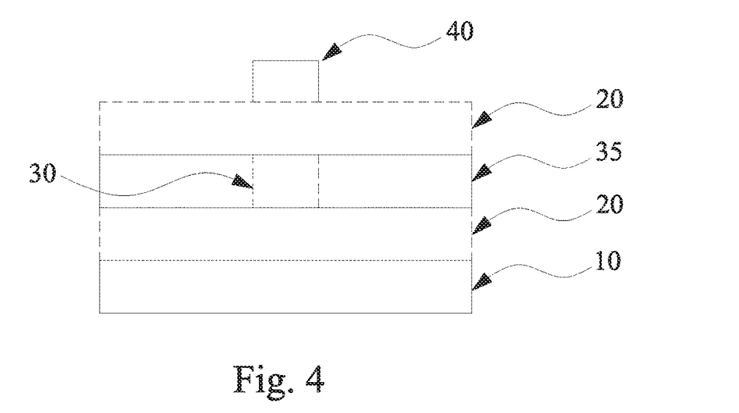
FIG. 4 is an exemplary cross sectional view along the line X2-X2' of FIG. 2.
Figure 5:
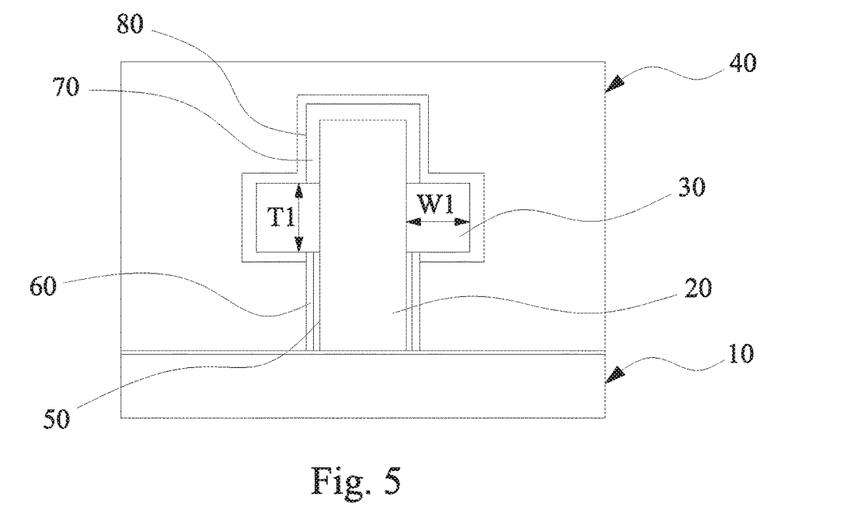
FIG. 5 is an exemplary cross sectional view along the line Y-Y' of FIG. 2.

FIG. 1 shows an exemplary perspective view of the Fin FET device according to one embodiment of the present disclosure. FIG. 2 is an exemplary plan view of the Fin FET according to one embodiment of the present disclosure. In FIG. 2, only one fin structure is illustrated. FIG. 3 is an exemplary cross sectional view along the line X1-X1' of FIG. 2, FIG. 4 is an exemplary cross sectional view along the line X2-X2' of FIG. 2, and FIG. 5 is an exemplary cross sectional view along the line Y-Y' of FIG. 2. In these figures, some layers/features are omitted for simplification.

The Fin FET device 1 includes, among other features, a substrate 10, a fin structure 20, channel layers 30, a gate dielectric 80 (shown in FIG. 5) and a gate electrode 40. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates such as amorphous Si or amorphous SiC, or insulating material such as silicon oxide may also be used as the substrate 10. The substrate 10 may include various regions that have been suitably doped with impurities (e.g., p-type or n-type conductivity).

The fin structure 20 is disposed over the substrate. The fin structure 20 may be made of the same material as the substrate 10 and may continuously extend from the substrate 10. In this embodiment, the fin structure is made of Si. The silicon layer of the fin structure 20 may be intrinsic, or doped with an n-type impurity or a p-type impurity. In this embodiment, the silicon layer of the fin structure is intrinsic.

In FIG. 1, three fin structures 20 are disposed over the substrate 10. However, the number of the fin structures is not limited to three. The numbers may be one, two or four or more. In addition, one of more dummy fin structures may be disposed at both sides of the fin structures 20 to improve pattern fidelity in patterning processes. The width of the fin structure 20 is in a range of about 5 nm to about 40 nm in some embodiments. The height of the fin structure 20 is in a range of about 10 nm to about 50 nm in some embodiments, and may be in a range of about 20 nm to 30 nm in other embodiments.

The lower part of the fin structure 20 is covered by a lower cover layer 45. The lower cover layer 45 is disposed over side faces (side walls) of the fin structure 20 and also disposed over the substrate 10. In some embodiments, the lower cover layer 45 includes a first liner layer 50 and a second liner layer 60 disposed over the first liner layer 50. The first liner layer 50 may be a silicon oxide liner layer and the second liner layer 60 may be a silicon nitride liner layer in some embodiments. The thickness of the first liner layer 50 is in a range of about 1 nm to about 15 nm in some embodiments. The thickness of the second liner layer 60 is in a range of about 1 nm to about 25 nm.

The upper part of the fin structure 20 is covered by an upper cover layer 70. The upper cover layer 70 is disposed over the side faces of the fin structure and also disposed over the top surface of the fin structure 20. In this embodiment, the upper cover layer 70 includes a silicon nitride layer. In some embodiments, the upper cover layer may be multiple layers including a first layer and a second layer disposed over the first layer, where the first layer may be a silicon oxide layer and the second layer may be a silicon nitride layer. The lower cover layer 45 and the upper cover layer 70 are spaced apart from each other. In some embodiments, the upper cover layer 70 is over the fin structure covered by the gate electrode 40 and is not over the fin structure not covered by the gate electrode 40, or the upper cover layer may not exist over the fin structure 20. The thickness of the upper cover layer 70 is in a range of about 1 nm to about 15 nm.

Channel layers 30 are disposed over both side faces of the fin structure 20 in the space between the lower cover layer 45 and the upper cover layer 70. The height T1 (vertical length, see. FIG. 5) of the channel layer 30 is smaller than a height of the fin structure 20. The channel layer 30 includes a Ge layer in some embodiments. In other embodiments, the channel layer 30 may include a stacked layer of, in the order closer to the side face of the fin structure, Ge, Si, Si/Ge, Si/Si$_{(1-x)}$Ge$_x$/Ge, Si/Si$_{(1-x)}$Ge$_x$ or Si$_{(1-x)}$Ge$_x$/Ge, where x may be about 0.15 or more and less than 1 in some embodiments. The channel layer 30 may be made by epitaxial silicon formed on silicon fin structure in certain embodiments. The thickness W1 (horizontal length, see. FIG. 5) of the channel layer 30 is in a range of about 5 nm to about 30 nm in some embodiments. The height T1 of the channel layer 30 is in a range of about 5 nm to about 120 nm in some embodiments.

Since two channel layers 30 are disposed per one fin structure, the number of channels is double compared with a case where one channel is formed on one fin structure.

As shown in FIG. 5, a gate electrode 40 is disposed over the fin structure so as to cover the channel layers 30. A gate dielectric layer 80 is interposed between the gate electrode 40 and the channel layer 30. The gate dielectric layer 80 is also disposed over the upper cover layer 70. The gate electrode 40, the gate dielectric layer 80 and the channel layers 30 constitute two MOS FETs. The two MOS FETs may be the same type (p/n) or different types, and the two channel layers 30 may be electrically coupled with each other. Part of the channel layer 35 not covered by the gate electrode 40 functions as a source and/or drain of the MOS FETs.

In certain embodiments, the gate dielectric layer 80 includes a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, work function adjustment layers (not shown) may be interposed between the gate dielectric layer 80 and the gate electrode 40. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. In some embodiments, the work function adjustment layer may include a first metal material for the n-channel Fin FET and a second metal material for the p-channel Fin FET. For example, the first metal material for the n-channel Fin FET may include metals having a work function substantially aligned with a work function of the substrate conduction band, or at least substantially aligned with a work function of the conduction band of the channel layer 30. Similarly, for example, the second metal material for the p-channel Fin FET may include metals having a work function substantially aligned with a work function of the substrate valence band, or at least substantially aligned with a work function of the valence band of the channel layer 30. In some embodiments, the work function adjustment layer may alternately include a polysilicon layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions 35 are also formed in the Ge channel layer 30 not covered by the gate electrode 40, by appropriately doping impurities in the source and drain regions 35. An alloy of Ge or Si and a metal such as Co, Ni, W, Ti or Ta may be formed on the source and drain regions 35.

Further, spaces between the fin structures and/or a space between one fin structure and another element formed over the substrate 10 are filled by shallow-trench-isolation (STI) oxide including an insulating material. The insulating material for the STI may include silicon oxide, silicon nitride, silicon oxynitride (SiON), SiOCN, fluoride-doped silicate glass (FSG), or a low-K dielectric material.

The structure of the channel layer 30 is not limited to the structure shown in FIG. 1 or 5. FIGS. 6-11 show exemplary cross sectional views of channel layers according to other embodiments of the present disclosure. In FIGS. 6-11, some features, for example, the first liner layer 50, the second liner layer 60, upper cover layer 70 and gate dielectric layer 80, are not shown for simplicity.

Figure 6:
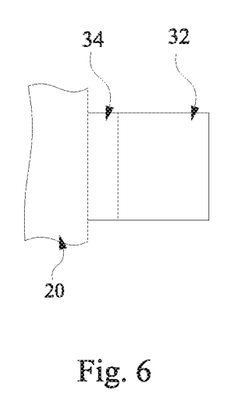
FIGS. 6-11 show is exemplary cross sectional views of channel layers according to some embodiments of the present disclosure.

In certain embodiments, as shown in FIG. 6, the channel layer 30 includes a Si layer 34 disposed over the side face of the fin structure 20 and a Ge layer 32 disposed over the Si layer 34. The Si layer 34 is an epitaxial Si layer and the Ge layer 32 is also an epitaxial Ge layer in some embodiments.

Figure 7:
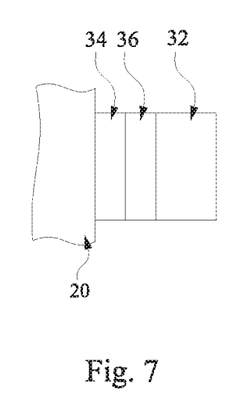

In certain embodiments, as shown in FIG. 7, the channel layer 30 includes a Si layer 34 disposed over the side face of the fin structure 20, a $Si_{(1-x)}Ge_x$ layer 36 disposed over the Si layer 34 and a Ge layer 32 disposed over the $Si_{(1-x)}Ge_x$ layer 36. The Si layer 34 is an epitaxial Si layer, the $Si_{(1-x)}Ge_x$ layer 36 is an epitaxial $Si_{(1-x)}Ge_x$ layer, and the Ge layer 32 is also an epitaxial Ge layer in some embodiments. The value of x is in a range of about 0.15 or more and less than 1.0 in some embodiments.

In some embodiments, the channel layer 30 may include, from the side face of the fin structure, Si, Ge/Si, $Si_{(1-x)}Ge_x$/Si, Ge/$Si_{(1-x)}Ge_x$/Si or $Si_{(1-x)}Ge_x$/Ge/Si. The channel layer 30 may be made by epitaxial silicon formed on silicon fin structure in certain embodiments.

Figure 8:
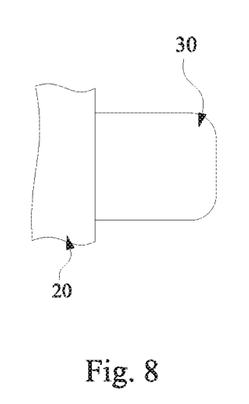
Figure 9:
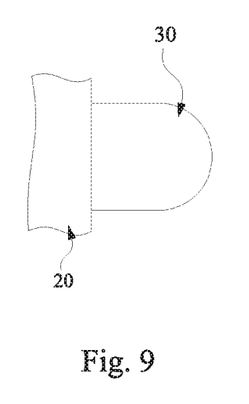
Figure 10:
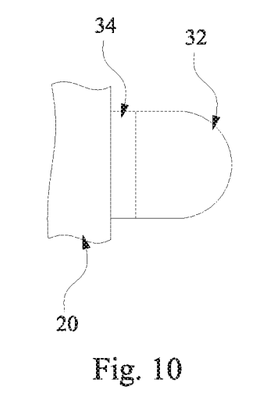
Figure 11:
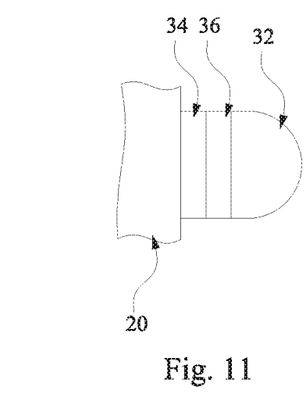

As shown in FIG. 8, corners of the channel layer 30 may have a rounded shape in some embodiments. Further, as shown in FIG. 9, the end portion of the channel layer 30 may have a rounded shape. Similar to FIGS. 6 and 7, the stacked layer of the Si layer 34 and the Ge layer 32 or the stacked layer of the Si layer 34, the $Si_{(1-x)}Ge_x$ layer 36 and the Ge layer 32 may be applicable to the channel layer having rounded corners and/or rounded end portion. For example, as shown in FIG. 10, the channel layer 30 includes a Si layer 34 disposed over the side face of the fin structure 20 and a Ge layer 32 disposed over the Si layer 34, and the corners of the Ge layer 32 are rounded. As shown in FIG. 11, the channel layer 30 includes a Si layer 34 disposed over the side face of the fin structure 20, a $Si_{(1-x)}Ge_x$ layer 36 disposed over the Si layer 34 and a Ge layer 32 disposed over the $Si_{(1-x)}Ge_x$ layer 36, and the corners of the Ge layer 32 are rounded. The rounded corners and/or end portion of the channel layer 30 may relax electric field concentration at the corner of the channel layer.

FIGS. 12-24 show cross sectional views of exemplary sequential processes of the Fin FET device according to one embodiment. It is understood that additional operations can be provided before, during, and after processes shown by FIGS. 12-24, and some of the operation described below can be replaced or eliminated, for additional embodiments of the method. The order of the operations/processes may be interchangeable.

Figure 12:
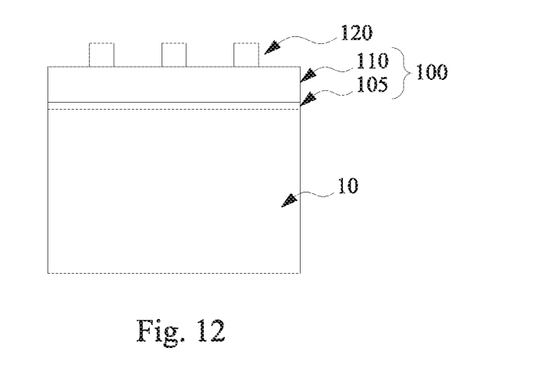
FIGS. 12-29 show exemplary processes for manufacturing the Fin FET device according to one embodiment of the present disclosure.

As shown in FIG. 12, a mask layer 100 is formed over the substrate 10 by, for example, a thermal oxidation process and/or a chemical vapor deposition (CVD) process. The substrate 10 is, for example, a silicon substrate. The mask layer 100 includes, for example, a pad oxide (e.g., silicon oxide) layer 105 and a silicon nitride mask layer 110 in some embodiments. The thickness of the pad oxide layer 105 is in a range of about 2 nm to about 15 nm and the thickness of the silicon nitride mask layer 110 is in a range of about 2 nm to about 50 nm in some embodiments. A mask pattern 120 is further formed over the mask layer 100. The mask pattern 120 is, for example, a photo resist pattern formed by photo lithography.

By using the mask pattern 120 as an etching mask, hard mask pattern of the pad oxide layer 105 and the silicon nitride mask layer 100 are formed. The width of the hard mask pattern is in a range of about 5 nm to about 40 nm in some embodiments. In certain embodiments, the width of the hard mask patterns is in a range of about 5 nm to about 30 nm.

Figure 13:
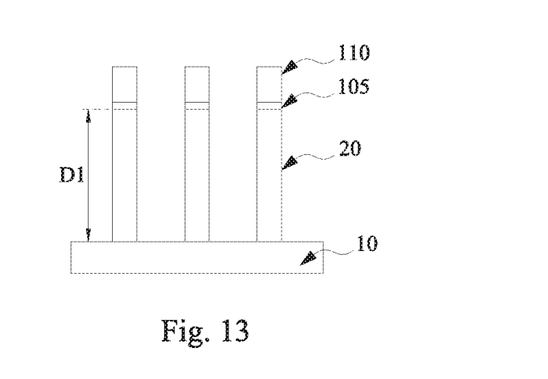

As shown in FIG. 13, by using the hard mask pattern as an etching mask, the substrate 10 is patterned into fin structures 20 by trench etching using a dry etching method and/or a wet etching method. A height D1 of the fin structure 20 is in a range of about 30 nm to about 300 nm. In certain embodiments, the height D1 is in a range of about 30 nm to about 200 nm. When the heights of the fin structures are not uniform, the height D1 from the substrate may be measured from the plane that corresponds to the average heights of the fin structures.

In this embodiment, a bulk silicon wafer is used as a starting material and constitutes the substrate 10. However, in some embodiment, other types of substrate may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

Figure 14:
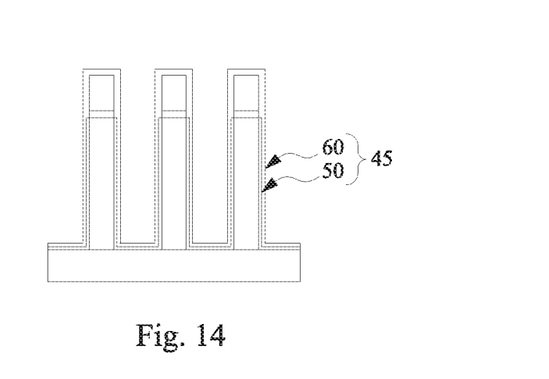

As shown in FIG. 14, a cover layer 45 is formed over the fin structure 20 by, for example, a thermal oxidation process and/or a CVD process. The cover layer 45 includes, for example, an oxide (e.g., silicon oxide) cover layer 50 and a silicon nitride (SiN) cover layer 60 in some embodiments. The oxide cover layer 50 may be formed by, for example, a thermal oxidation process on the side walls of the fin structures 20. Then, the SiN cover layer 60 may be formed by a CVD process. Other film forming methods can be applied in forming the oxide cover layer 50 and/or the SiN cover layer 60. The thickness of the oxide cover layer 50 is in a range of about 1 nm to about 15 nm and the thickness of the silicon nitride cover layer 60 is in a range of about 1 nm to about 25 nm in some embodiments.

The SiN cover layer 60 may be deposited by physical vapor deposition (PVD) (sputtering), CVD, plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes. In a LPCVD process, a silicon source such as $Si_2H_6$, $SiH_4$ and/or $Si_2Cl_6$ and a nitrogen source such as $NH_3$ and/or $N_2$ are used and the SiN film is formed at a temperature in a range of about 900-1200° C. under a reduced pressure in a range of about 0.01 to 10 Torr (about 1.33 Pa to about 1333 Pa) in some embodiments. In a plasma CVD process, the process temperature is in a range of 250-500° C.

Figure 15:
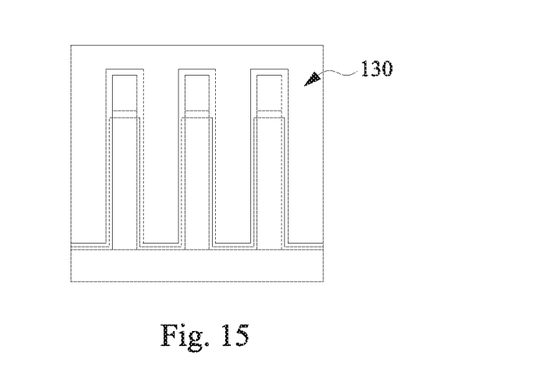

As shown in FIG. 15, a sacrificial layer 130 is formed so that the fin structures are embedded in the sacrificial layer 130. The fin structures 20 may be fully or partially embedded in the sacrificial layer 130. In this embodiment, the sacrificial layer is a photo resist layer. The photo resist layer is formed by spin coating. The photo resist layer may be replaced with any organic resin (e.g., non-photosensitive resins) layer or inorganic layer. A material for a bottom anti-reflection coating may be used.

Figure 16:
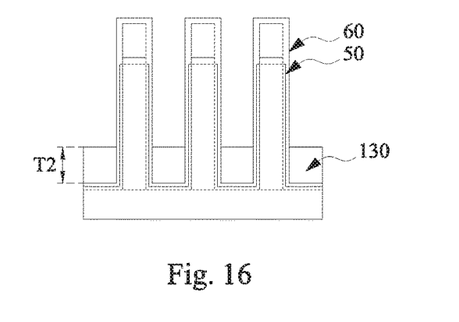

Then, as shown in FIG. 16, the thickness of the sacrificial layer 130 is reduced by, for example, an etch-back process so as to expose a part of the fin structures. The etch-back process of the photo resist may be performed by using plasma including $O_2$ and at least one of $CF_4$ and $CHF_3$, at a temperature in a range about 0° C. to about 300° C. and at a pressure in a range of about 1 to about 10 Torr (about 133 Pa to about 1333 Pa) in certain embodiments. By adjusting etching time, a desired thickness of the remaining photo resist layer can be obtained. The remaining thickness T2 is adjusted to a range of about 10 nm to about 150 nm in some embodiments.

Instead of etching-back the thick resist layer, it may be possible to form a thin sacrificial layer of the photo resist having the thickness T2 directly by adjusting, for example, the spin coating condition.

Figure 17:
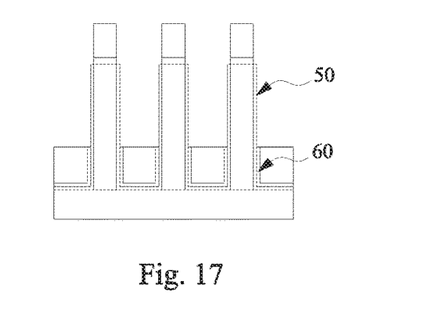

Next, as shown in FIG. 17, part of the silicon nitride cover layer 60 exposed from the sacrificial layer 130 is removed by plasma etching or wet etching.

Figure 18:
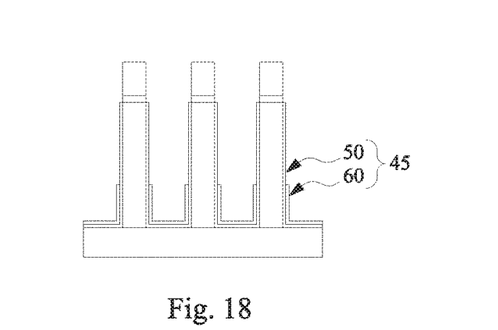

The remaining sacrificial layer 130 is removed by, for example, an ashing process and/or a wet cleaning process, as shown in FIG. 18.

Figure 19:
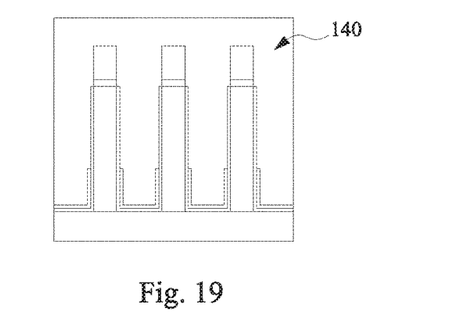

As shown in FIG. 19, an isolation insulating layer 140 is formed. The fin structures 20 may be fully or partially embedded in the isolation insulating layer 140. The isolation insulating layer 140 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl SilsesQuioxane (MSQ), a hydrogen SilsesQuioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layer 140 may be formed by SOG. SiO, SiON, SiOCN or fluoride-doped silicate glass (FSG) may be used as the isolation insulating layer in some embodiments. After forming the isolation insulating layer 140, a thermal process, for example, an anneal process, may be performed to improve the quality of the isolation insulating layer.

Figure 20:
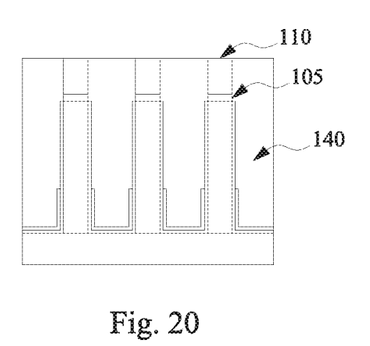

As shown in FIG. 20, part of the isolation layer 140 is removed by, for example, a chemical mechanical polishing (CMP) method or other planarization methods such as an etch-back process, so that the top surface of the silicon nitride mask layer 110 is exposed. The top portions of the silicon nitride mask layer 110 may be slightly etched.

Figure 21:
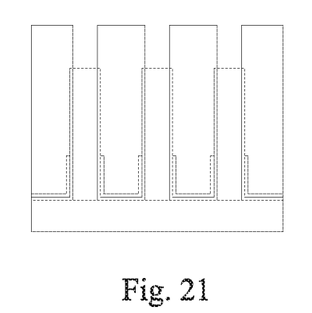

As shown in FIG. 21, the silicon nitride mask layer 110 is removed, by wet etching and/or dry etching process. The pad oxide layer 105 is also removed.

Figure 22:
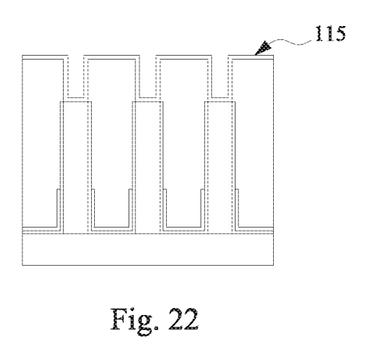

As shown FIG. 22, a silicon nitride (SiN) layer 115 is formed. The SiN layer 115 may be formed by a CVD process similar to the SiN cover layer 60 as explained above. The thickness of the SiN layer 115 is in a range of about 2 nm to about 15 nm in some embodiments.

Figure 23:
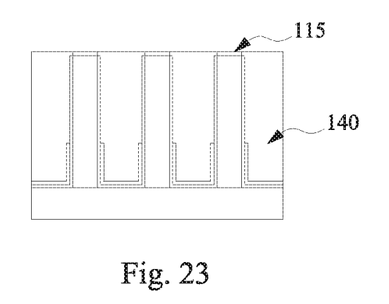

As shown in FIG. 23, a planarization operation is performed to remove the unnecessary portions of the SiN layer 115 and the isolation layer 140 so that SiN layer 115 remains only on the top surface of the fin structure 20. The thickness of the remaining SiN layer 115 after the planarization operation is in a range of about 2 nm to about 8 nm in some embodiments.

Figure 24:
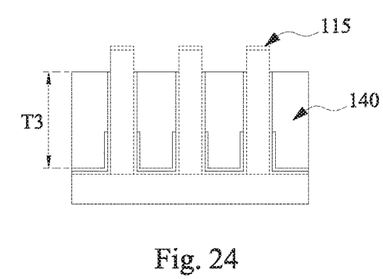

As shown in FIG. 24, the thickness of the isolation insulating layer 140 is reduced by, for example, an etch-back process so as to expose a part of the fin structure 20. The etch-back process may be performed by using dry etching or wet etching. By adjusting etching time, a desired thickness of the remaining insulating layer 140 can be obtained. In the present disclosure, the thickness T3 is adjusted to be in a range of about 15 nm to about 270 nm in some embodiments. Here, T3 is about T1+T2. In this process, the silicon oxide layer 60 at the tope portion of the fin structure 20 is also removed.

Figure 25:
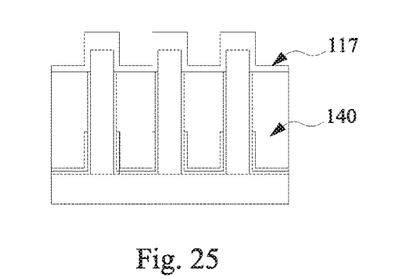

As shown in FIG. 25, another silicon nitride (SiN) layer 117 is formed. The SiN layer 117 may be formed by a CVD process similar to the SiN cover layer 60 as explained above. The thickness of the SiN layer 117 is in a range of about 1 nm to about 15 nm in some embodiments.

Figure 26:
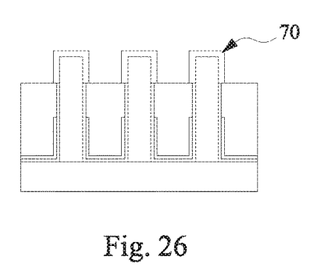

As shown in FIG. 26, an etch-back process is performed to remove unnecessary portion of the SiN layer 117 so that an upper cover layer 70 is formed over the upper portion of the fin structure 20. The thickness of the resultant upper cover layer 70 is in a range of about 2 nm to about 40 nm in some embodiments. The thickness of upper cover layer 70 is not limited to this range and may depend upon the etching condition or other process factors.

Figure 27:
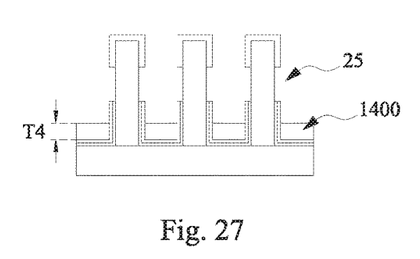

As shown in FIG. 27, the thickness of the remaining isolation insulating layer 140 is further reduced by, for example, an etch-back process so as to expose a center part 25 of the fin structure 20, which is not covered by the SiN cover layer 60 and the upper cover layer 70. The etch-back process may be performed by using dry etching or wet etching. By adjusting etching time, a desired thickness of the remaining isolation insulating layer 140 can be obtained. In the present disclosure, the thickness T4 of the remaining isolation insulating layer 140 is adjusted to be in a range of about 10 nm to about 100 nm in some embodiments. T4 is smaller than T2. In some embodiments, the isolation insulating layer 140 may be fully removed. In this process, the silicon oxide layer 60 in the center part 25 is also removed, and the lower cover layer 45 is obtained.

Figure 28:
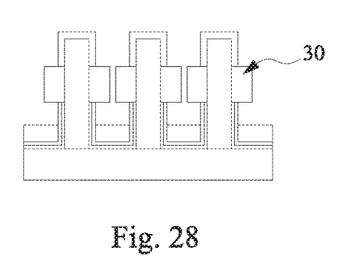

A shown in FIG. 28, channel layers 30 are formed over the exposed portion 25 of the fin structure 20. The channel layer 30 may be a Ge layer, a stacked layer of Si and Ge or a stacked layer of Si, $Si_{(1-x)}Ge_x$ and Ge, or even a Si layer, as explained with respect to FIGS. 6-11.

When the channel layer 30 is made of Ge, the Ge layer is epitaxially grown on the exposed portion 25 by using, for example, GeH$_4$ and/or Ge$_2$H$_6$ as source gas at a temperature in a range of about 300° C. to about 500° C. and at a pressure in a range of about 10 Torr to about 500 Torr.

The Si$_{(1-x)}$Ge$_x$ layer may be epitaxially grown by using, for example, SiH$_2$Cl$_2$ and/or SiH$_4$ and GeH$_4$ and/or Ge$_2$H$_6$ as source gas at a temperature in a range of about 500° C. to about 700° C. and at a pressure in a range of about 10 Torr to about 100 Torr. The value of x may be constant in the Si$_{(1-x)}$Ge$_x$ layer or may increase in the Si$_{(1-x)}$Ge$_x$ layer as being grown. The Si layer may also be epitaxially grown by using, for example, SiH$_2$Cl$_2$ and/or SiH$_4$ as source gas at a temperature in a range of about 600° C. to about 800° C. and at a pressure in a range of about 10 Torr to about 100 Torr. The channel layer 30 may appropriately be doped with, for example, boron and/or phosphorous in an amount of about $1 \times 10^{19}$ to $5 \times 10^{19}$ cm$^{-3}$, in some embodiments.

Figure 29:
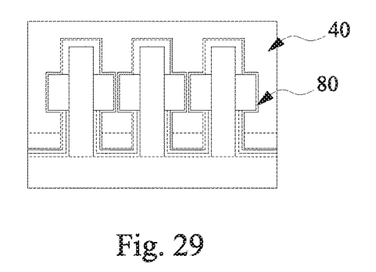

As shown in FIG. 29, the gate structure is formed over the fin structure 20 with the channel layers 30.

The gate dielectric layer 80 is formed by CVD, PVD, ALD e-beam evaporation, or other suitable process. When the gate dielectric layer 80 is silicon oxide, SiH$_4$, Si$_2$H$_6$ and/or Si$_2$Cl$_6$ is used as a source gas. When the gate dielectric layer 80 is silicon nitride, SiH$_4$, Si$_2$H$_6$ and/or Si$_2$Cl$_6$ and NH$_3$ are used as source gases. When the gate dielectric layer 80 is hafnium oxide, zirconium oxide, aluminum oxide or titanium oxide, metal hydride, metal chloride and/or organic metal including Hf, Zr, Al or Ti is used as a source gas.

The gate electrode 40 may be formed by a film forming process by using ALD, PVD, CVD, e-beam evaporation, electroplating or other suitable process, and a patterning process. Metal hydride, metal chloride and/or organic metal including Ti, Ta, Co, Si, Zr, Al or W is used as a source gas. The gate structure may be formed using a gate-last or replacement gate methodology.

Figure 30:
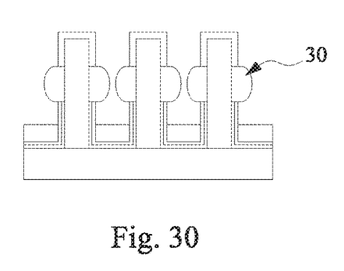
FIGS. 30 and 31 show exemplary processes for manufacturing the Fin FET device according to another embodiment of the present disclosure.
Figure 31:
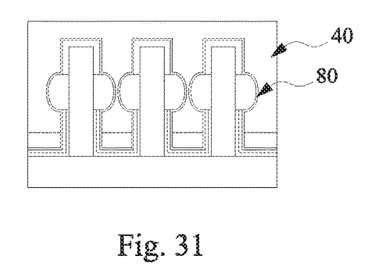

FIGS. 30 and 31 show cross sectional views of another exemplary sequential process of the Fin FET device according to one embodiment.

After the channel layers 30 are formed as shown in FIG. 28, a plasma treatment is performed on the channel layer 30 so that the corners and/or the end portion of the channel layer 30 are rounded as shown in FIG. 30. Then, as shown in FIG. 31, the gate structure is formed over the fin structure 20 with the rounded channel layers 30.

FIGS. 32-35 show exemplary processes for manufacturing the Fin FET device according to yet another embodiment of the present disclosure.

Figure 32:
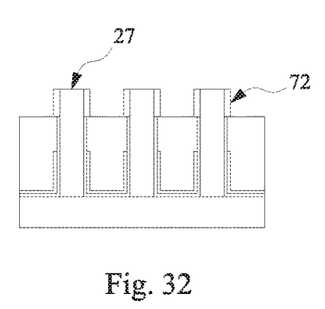
FIGS. 32-35 show exemplary processes for manufacturing the Fin FET device according to yet another embodiment of the present disclosure.

After the process shown in FIG. 26, portion of the SiN cap layer 70 disposed over the upper surface of the fin structure 20 is removed, by for example, a CMP process so that the upper surface 27 of the fin structure 20 is exposed, as shown in FIG. 32.

Figure 33:
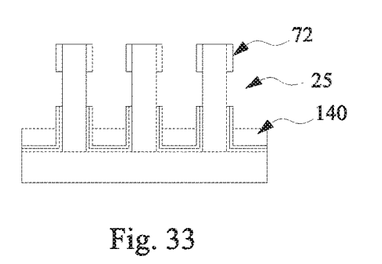

Similar to FIG. 27, the thickness of the remaining isolation insulating layer 140 is further reduced by, for example, an etch-back process so as to expose a center part 25 of the fin structure 20, which is not covered by the SiN cover layer 60 and the upper cover layer 72, as shown in FIG. 33.

Figure 34:
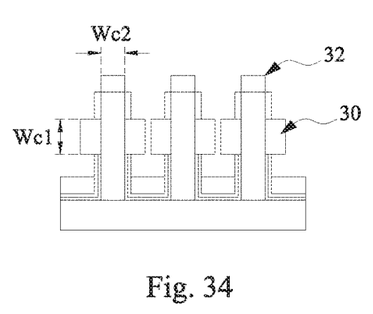

A shown in FIG. 34, channel layers 30 and a third channel layer 32 are formed over the exposed portion 25 and exposed upper surface 27 of the fin structure 20, similar to FIG. 28. The channel layers 30 and 32 may be a Ge layer, a stacked layer of Si and Ge or a stacked layer of Si, Si$_{(1-x)}$Ge$_x$ and Ge, as explained with respect to FIGS. 6-11. The dimension Wc1 of the channel layers 30 and the dimension Wc2 of the third channel layer 32 may be the same or different, the conduction type of the third channel 32 may be the same as or different from the conduction type of the channel layer 30.

Figure 35:
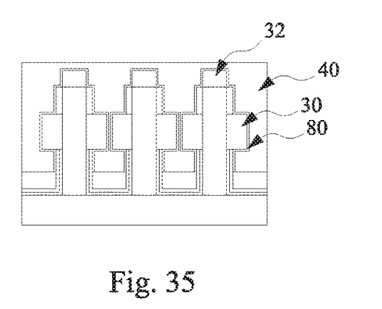

As shown in FIG. 35, the gate structure including gate electrode 40 and gate dielectric layer 80 is formed similar to FIG. 29, thereby forming a three-channel MOS Fin FET.

FIGS. 36-39 show exemplary processes for manufacturing the Fin FET device according to another embodiment of the present disclosure.

Figure 36:
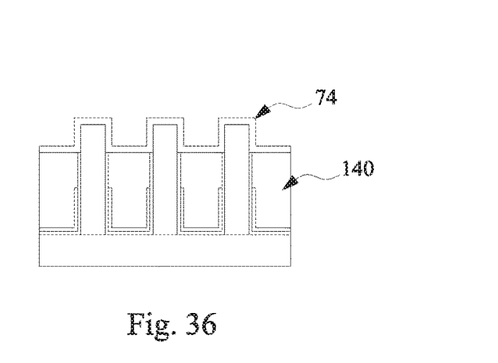
FIGS. 36-39 show exemplary processes for manufacturing the Fin FET device according to another embodiment of the present disclosure.

In the process shown in FIG. 23, the SiN layer 115 is removed from the top surface of the fin structure 20. The SiN layer 115 may slightly be remained. Then, the process shown in FIG. 24 is performed to reduce the height of the isolation layer 140. After these processes, a cap layer 74 is formed over the fin structure 20 and interlayer insulating layer 140, as shown in FIG. 36.

Figure 38:
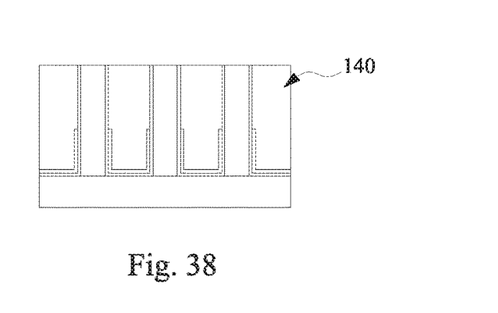

In the alternative, as shown in FIG. 38, after the process shown in FIG. 19, the hard mask patterns formed by the oxide layer 105 and the nitride layer 110 and top portions of the isolation insulating layers 140 are removed by, for example, a chemical mechanical polishing (CMP) method or other planarization methods such as an etch-back process. The top portions of the fin structure 20 may be slightly etched.

Figure 39:
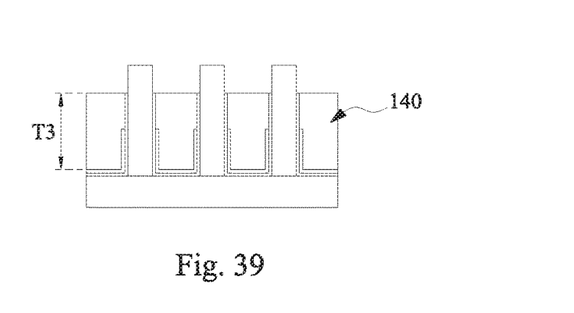

As shown in FIG. 39, the thickness of the isolation insulating layer 140 is reduced by, for example, an etch-back process so as to expose a part of the fin structure 20. The etch-back process may be performed by using dry etching or wet etching. By adjusting etching time, a desired thickness of the remaining insulating layer 140 can be obtained. In the present disclosure, the thickness T3 is adjusted to be in a range of about 15 nm to about 270 nm in some embodiments. In this process, the silicon oxide layer 60 at the tope portion of the fin structure 20 is also removed. After the process shown in FIG. 39, a cap layer 74 is formed over the fin structure 20 and interlayer insulating layer 140, as shown in FIG. 36.

Figure 37:
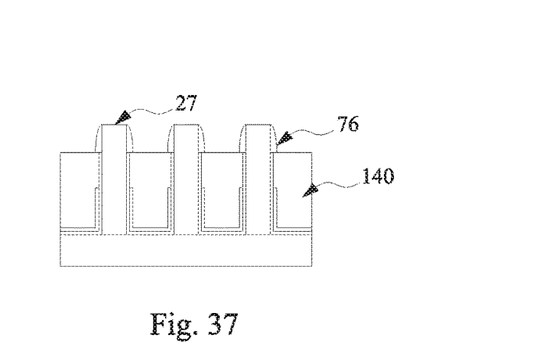

By using an etching process such as a plasma dry etching, side walls 76 are formed so that the upper surface 27 of the fin structure 20 is exposed, as shown in FIG. 37. Then, the channel layer 30 and third channel layer 32 are formed similar to FIG. 34, and the gate structure is further formed similar to FIG. 35, thereby forming a three-channel MOS Fin FET.

The various embodiments or examples described herein offer several advantages over the existing art. For example, in the present disclosure, since two channel layers including a Ge layer are disposed per one fin structure, the number of channels is double compared with a case where one channel is formed on one fin structure, and therefore a high density of high speed transistor using a Ge channel can be obtained.

It will be understood that not all advantages have been necessarily discussed herein, no particular advantage is required for all embodiments or examples, and other embodiments or examples may offer different advantages.

In accordance with one aspect of the present disclosure, a semiconductor device includes a fin structure for a fin field effect transistor (FET). The semiconductor device includes a fin structure protruding from a substrate and having a top face and a first side face and a second side face opposite to the first side face, and first semiconductor layers disposed over the first and second side faces of the fin structure. The thickness in a vertical direction of the first semiconductor layers is smaller than a height of the fin structure.

In accordance with another aspect of the present disclosure, a semiconductor device includes a fin structure for a fin field effect transistor (FET). The semiconductor device includes a fin structure protruding from a substrate and having a top face and a first side face and a second side face opposite to the first side face, first semiconductor layers disposed over the first and second side faces of the fin structure, and a second semiconductor layer disposed over the top face of the fin structure.

In accordance with another aspect of the present disclosure, a method for manufacturing a semiconductor device includes the following operations. A fin structure having a top face and a first side face and a second side face opposite to the first side face is formed. A lower cover layer is formed over the first and second side faces. An upper cover layer is formed over the first and second side faces. The upper cover layer is spaced apart from the lower cover layer so that exposed regions of the first and second side faces are formed between the lower cover layer and the upper cover layer. First semiconductor layers are formed over the exposed regions of the first and second side faces, respectively.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin structure protruding from a substrate and having first and second side faces and a top surface connecting the first and second side faces;
first and second semiconductor layers protruding from the first and second side faces of the fin structure, respectively; and
a third semiconductor layer extending from the top face of the fin structure,
wherein the third semiconductor layer is made of a different material than the fin structure.

2. The semiconductor device of claim 1, wherein the first to third semiconductor layers are made of the same material.

3. The semiconductor device of claim 1, wherein the first and second semiconductor layers are made of a material different from that is used to make the third semiconductor layer.

4. The semiconductor device of claim 1, wherein the first to third semiconductor layers include a Ge containing layer.

5. The semiconductor device of claim 1, wherein each of the first to third semiconductor layers includes a Si layer and a Ge layer disposed over the Si layer.

6. The semiconductor device of claim 1, wherein each of the first to third semiconductor layers includes a Si layer, a $Si_{(1-x)}Ge_x$ layer disposed over the Si layer and a Ge layer disposed over the $Si_{(1-x)}Ge_x$ layer, where $0.15 \leq x < 1$.

7. The semiconductor device of claim 6, wherein an interface between the Si layer and the $Si_{(1-x)}Ge_x$ layer is curved.

8. The semiconductor device of claim 1, further comprising:
a gate electrode covering the first to third semiconductor layers; and
an insulating layer interposed between the gate electrode and the first to third semiconductor layers.

9. The semiconductor device of claim 8, wherein the insulating layer is spaced apart from the substrate.

10. The semiconductor device of claim 1, wherein the first and second semiconductor layers are spaced apart from the third semiconductor layer.

11. The semiconductor device of claim 1, wherein corners of the first and second semiconductor layers have a rounded shape.

12. The semiconductor device of claim 1, further comprising a lower cover layer disposed over a lower part of the first and second side faces of the fin structure, the lower part being between the substrate and the first and second semiconductor layers.

13. The semiconductor device of claim 12, wherein the lower cover layer extends from the first and second side faces of the fin structure onto a surface of the substrate.

14. The semiconductor device of claim 12, wherein the lower cover layer includes first and second liner layers stacking on the lower part of the first and second side faces of the fin structure.

15. The semiconductor device of claim 1, further comprising an upper cover layer covering an upper part of the first and second side faces of the fin structure, the upper cover layer being disposed on a level above the first and second semiconductor layers with reference to the substrate.

16. A semiconductor device, comprising:
fin structures, each of the fin structures protruding from a substrate and have first and second side faces and a top face connecting the first and second side faces, wherein:
each of the fin structures includes first and second semiconductor layers protruding from the first and second side faces of the each of the fin structures, respectively, and a third semiconductor layer extending from the top surface of the each of the fin structures,
the semiconductor device further comprises:
a gate electrode covering the first to third semiconductor layers of the fin structures; and
gate insulating layers, each of the gate insulating layers interposed between the gate electrode and the first to third semiconductor layers of a respective one of the fin structures,
wherein the third semiconductor layer is made of a different material than the fin structures.

17. The semiconductor device of claim 16, wherein the first to third semiconductor layers include a Ge containing layer.

18. The semiconductor device of claim 16, wherein the first and second semiconductor layers of the respective one of the fin structures are spaced apart from the third semiconductor layer of the respective one of the fin structures.

19. A semiconductor device, comprising:
a fin structure protruding from a substrate, and having first and second side faces and a second side face connecting the first and second side faces;
a first channel region made of a semiconductor material different from the fin structure protruding from at least one of the first side surface or the second side surface;
a second channel region made of a semiconductor material different from the fin structure extending from the top surface; and
a gate electrode covering the first and second channel regions, and an upper portion of the fin structure between the first and second channel regions, wherein:
the gate electrode is spaced-apart from the first and second channel regions by a first insulating layer, and is spaced-apart from the upper portion of the fin structure by a second insulating layer, and a thickness of the first insulating layer is less than a thickness of the second insulating layer.

20. The semiconductor device of claim 19, wherein the first and second channel regions layer include a Ge containing layer.

* * * * *